United States Patent [19]

Nishioka et al.

[11] Patent Number: 5,424,684
[45] Date of Patent: Jun. 13, 1995

[54] POWER AMPLIFIER CIRCUIT FOR AUDIO SIGNAL AND AUDIO DEVICE USING THE SAME

[75] Inventors: Kei Nishioka; Masanori Fujisawa, both of Kyoto, Japan

[73] Assignee: Rohm Co., Ltd., Kyoto, Japan

[21] Appl. No.: 203,307

[22] Filed: Mar. 1, 1994

[30] Foreign Application Priority Data

| Mar. 4, 1993 | [JP] | Japan | 5-069380 |
| Mar. 4, 1993 | [JP] | Japan | 5-069381 |
| Mar. 4, 1993 | [JP] | Japan | 5-069382 |

[51] Int. Cl.⁶ .................................. H03F 3/26
[52] U.S. Cl. ............................. 330/273; 330/297; 330/146
[58] Field of Search ............... 330/146, 202, 267, 273, 330/297; 381/120, 121

[56] References Cited

U.S. PATENT DOCUMENTS

| 4,218,660 | 8/1980 | Carver | 330/263 X |
| 4,472,687 | 9/1984 | Kashiwagi et al. | 330/263 X |
| 4,507,619 | 3/1985 | Dijkstra et al. | 330/263 X |
| 4,752,747 | 6/1988 | Botti et al. | 330/297 |
| 5,075,634 | 12/1991 | French | 330/297 X |
| 5,200,711 | 4/1993 | Andersson et al. | 330/267 |

*Primary Examiner*—James B. Mullins
*Attorney, Agent, or Firm*—Fay, Sharpe, Beall, Fagan, Minnich & McKee

[57] ABSTRACT

The present invention includes a first push-pull amplifier for amplifying an audio signal, a second push-pull amplifier for inverting and amplifying the audio signal, a switching circuit for switching power from a power source line at a frequency exceeding an audible frequency and feeding the first or second amplifier and a control circuit for controlling a switching period of the switching circuit such that the feeding power is changed correspondingly to a level of the audio signal correspondingly to a first difference in voltage between one of the audio signal and the audio signal amplified by the amplifier and the power or a second difference in voltage between one of the audio signal and the audio signal amplified by the second amplifier and the feeding power, a loud speaker being driven by outputs of the first and second amplifiers.

10 Claims, 10 Drawing Sheets

BLOCK DIAGRAM

WAVEFORM

POWER AMPLIFIER CIRCUIT FOR AUDIO SIGNAL AND AUDIO DEVICE USING THE SAME

DESCRIPTION

Technical Field

The present invention relates to a power amplifier circuit for an audio signal and an audio device using the same and, particularly, to a power amplifier circuit capable of reducing power consumption in a Balanced Transformer Less (BTL) type output circuit of an audio device, particularly, a portable audio device, such as a radio receiver, a cassette tape recorder, video tape recorder, a video camera or a component stereo device, which amplifies an audio signal (voice or music) and outputs sound by driving a loud speaker by the BTL output circuit.

Background Art

FIG. 11(a) shows a schematic block circuit diagram of a conventional portable cassette tape player as an example of the BTL output circuit. 1 depicts a read head, 2 a signal reproduction processing circuit including a head amplifier and an equalizer circuit, etc., 3 an output stage amplifier of positive phase side (non-inverted output side), 4 a loud speaker as a load and 5 an output stage amplifier of inverted phase side (inverted output side).

During reproduction, the audio signal recorded on a tape (not shown) is read out therefrom through the read head 1 as a read signal A which is an input audio signal. The read signal A is inputted to the signal reproduction processing circuit 2 in which a high frequency bias component thereof during recording is removed and, after equalization processing, outputted as an audio signal B. The thus reproduced audio signal B is finally amplified by the output stage amplifiers 3 and 5 in which output signals C and C' are produced and the loud speaker 4 is driven by these outputs. As a result, a reproduced sound is generated by the loud speaker 4.

It is usual that the transistor amplifiers 3 and 5 include in their input stages input stage amplifiers 3a and 5a for producing a pair of signals. The audio signal B is amplified by the input stage amplifier 3a and made into a pair of signals whose phases are different from each other by 180°. These signals are amplified by push-pull transistors Q1 and Q2 which constitute an output stage amplifier to provide amplified output signal C. The audio signal B is inverted and amplified by the input stage amplifier 5a, amplified similarly by push-pull transistors Q3 and Q4 and power-amplified to provide the output signal C'.

A description of the power amplification in the output stage amplifier 3 as an example follows. A voltage of a power line Vcc which feeds the output stage amplifier 3 in accordance to the input signal B is lowered by the transistor Q1 to a voltage level of the output signal C. In other words, the output signal C is produced as a result of an amount of voltage drop by an internal impedance of the transistor Q1 and is changed according to a waveform of the audio signal B. In this case, the transistor Q1 handles a voltage difference between the line voltage Vcc and the voltage of the output signal C. As a result, the transistor Q1 consumes a power corresponding to the voltage difference.

Although the output stage amplifier is shown in the figure as comprising a simple circuit including the output transistors Q1 and Q2, a peripheral circuit including a drive circuit, etc., may be included in a practical circuit construction. The above matter is the same for the output stage amplifier 5. Particularly, in the case of the BTL circuit, although the input stage amplifiers 3a and 5a are constructed by differential amplifiers and there is provided negative feedback from the output terminals of the amplifiers 3 and 5 to the inverted input sides of the input differential amplifiers 3a and 5a to which a reference voltage (corresponding to Vcc/2 where Vcc is a power source voltage) is supplied, such is omitted in the figure since it has no direct relation to the present invention.

Describing the operation of the BTL output stage amplifiers 3 and 5 in detail, when a voltage value of the audio signal B is higher than the reference voltage (Vcc/2), the transistor Q1 on the side of the power source is made active by the output of the input stage amplifier 3a and the transistor Q2 on the ground side is cut off. Further, the transistor Q3 on the side of the power source is cut off and the transistor Q4 on the ground side is made active by the output of the input stage amplifier 5a. And, current corresponding to the voltage value of the audio signal B flows from the power source line Vcc through the transistor Q1, the loud speaker 4 and the transistor Q4 to ground.

When the voltage value of the audio signal B is lower than the reference voltage, the ON and OFF operations of the transistors are reversed with respect to those mentioned above and current corresponding to the voltage value of the audio signal B flows from the power source line Vcc through the transistor Q3, the loud speaker 4 and the transistor Q2 to ground.

When the voltage value of the audio signal B is equal to the reference voltage, the respective transistors are in an OFF state. In this case, due to the negative feedback to the input stage amplifiers 3a and 5a, output terminals of the amplifiers 3 and 5 become Vcc/2, respectively.

Power consumed by the respective transistors Q1, Q2, Q3 and Q4 when the pair of output stage amplifiers 3 and 5 which operate in reverse phase to each other are provided and are operated in BTL operation in this manner is shown by hatching in FIG. 11(b). In this figure, power consumption of these transistors is shown by areas hatched with lines in different directions.

Power caused by the voltage drop of the output transistors shown by the hatching is dissipated by the power amplifier transistor as heat. Therefore, transistors whose power loss is large are required. Since a large power is consumed there, power efficiency in the case of the production of the output signals C and C' by the BTL circuit is low.

This fact is a problem in a portable audio device which is operated by a battery of limited capacity since an operating time thereof depends upon the efficient utilization of power. Further, for such a device, it is very important, as a commercial product, that it is operable for a long period of time. Therefore, power consumption of the device should be as small as possible.

SUMMARY OF THE INVENTION

An object of the present invention is to provide a BTL power amplifier circuit for an audio signal, which is capable of reducing power consumption of an output circuit thereof.

Another object of the present invention is to provide a power amplifier circuit for an audio signal, which can use transistors whose power loss is small by reduction of power consumption of the transistors of the output circuit thereof.

A further object of the present invention is to provide an audio device capable of reducing power consumption of an output circuit thereof.

A still further object of the present invention is to provide an audio device which is suitable as a portable device.

A power amplifier circuit for an audio signal and an audio device using the same according to the present invention, which achieves the above objects, is featured by comprising a first push-pull amplifier for amplifying an audio signal, a second push-pull amplifier for inverting and amplifying the audio signal, a switching circuit responsive to a frequency exceeding an audible frequency for supplying a power from a power line to the first or second amplifiers and a control circuit for controlling a switching period of the switching circuit such that a power supplied in accordance to one of a first voltage difference between a power line voltage and either one of a voltage of the audio signal and a voltage of an amplified audio signal obtained by amplifying the audio signal by the amplifier and a second voltage difference between the power line voltage and either one of the voltage of the audio signal and a voltage of an amplified audio signal obtained by amplifying the audio signal by the second amplifier is changed correspondence with a level of the audio signal, and wherein the output of the first amplifier and the second amplifier drive S the loud speaker.

By providing such a control circuit and such a switching circuit between the first or second amplifiers and the power line, the power to be supplied to the amplifiers is generated by a switching control. Further, the voltage of the power supplied to the amplifiers is fedback correspondingly to the voltage of the audio signal. Therefore, it is possible to keep the voltage difference between the voltages of the supplied power and the output signal of the amplifier constant. Thus, it is possible to keep the constant voltage difference at a minimum voltage necessary for the operation of the amplifier or at a constant value within a low voltage range if it is not the minimum voltage.

The constant voltage difference (constant voltage) corresponds, in the amplifier, to a voltage drop for generating the output signal. Therefore, in this case, the amplification is performed while the voltage drop in the amplifiers is kept at the minimum voltage or at the constant low voltage. A current value of the output signal in this case is determined by the power supplied from the switching circuit and corresponds to the input audio signal. Further, power consumption of the amplifier in this case is substantially determined by the above mentioned constant voltage. Therefore, the power consumption becomes smaller compared with that when an output signal is obtained by a direct voltage drop from the constant supply voltage as in the conventional system.

On the other hand, a total power loss of the switching circuit and the control circuit, for switching the source line voltage Vcc, is mainly generated transiently only at the switching time since an ON resistance of a switching transistor thereof is low. The power loss is very minor compared with the conventional system in which such loss is generated always. An increase of power consumption due to this is relatively small compared with power consumption in the power amplifier stage. Therefore, it is possible to reduce power loss consumed by amplification of an audio signal as a whole. For this reason, it is possible to improve the power utilization efficiency.

In the present invention, the switching of the power supply line is performed at a timing exceeding an audible frequency. Therefore, even if a distortion component caused by the switching operation is included in the amplified audio signal, that component is barely audible. Therefore, the quality of the audio signal is not degraded practically and the audio performance of the device can be maintained.

DESCRIPTION OF THE PREFERRED EMBODIMENTS

Figure 1:
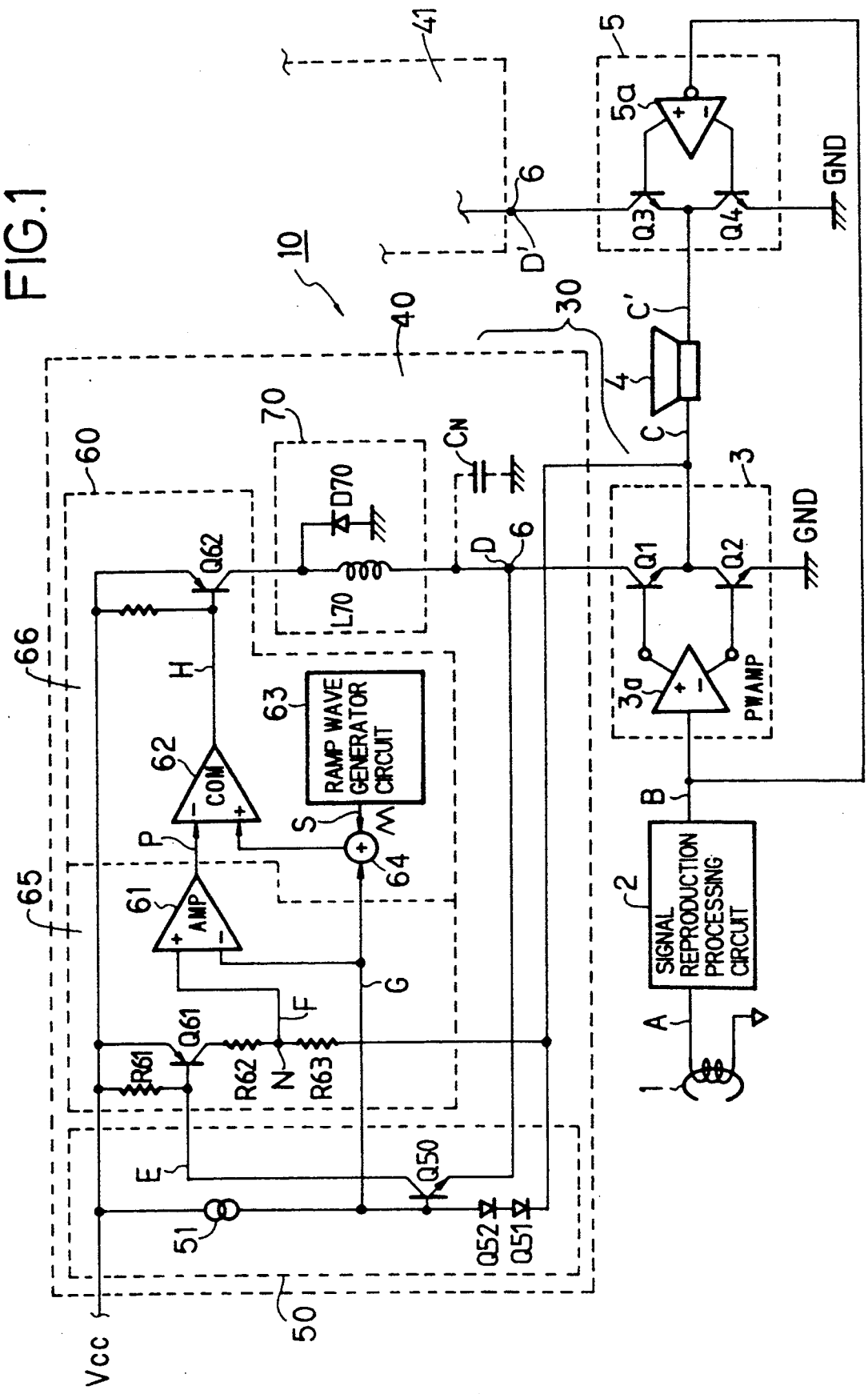
FIG. 1 is a block diagram of an audio device according to an embodiment of the present invention when applied to a portable cassette tape player.
Figure 11A:
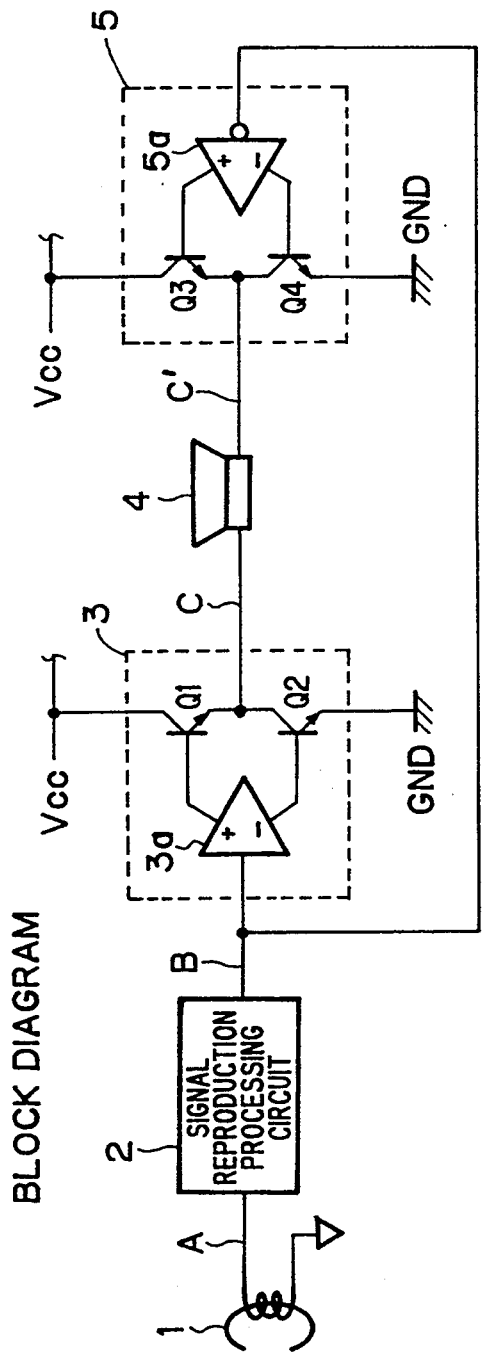
FIGS. 11(a) and 11(b) are a block diagram of a portable cassette tape player using a conventional BTL output circuit and a diagram of the power consumption of its output transistor, respectively.
Figure 11B:
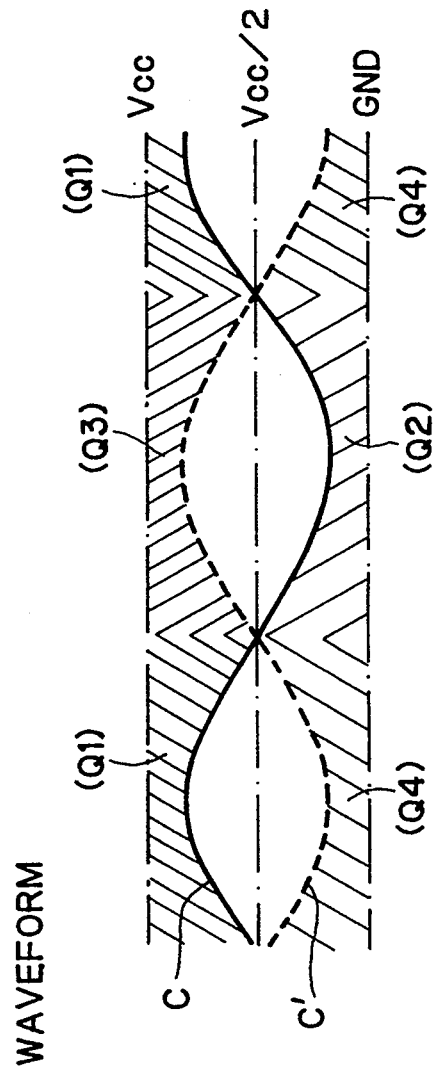

In FIG. 1, an output stage circuit 30 is an output stage amplifier circuit of a portable cassette tape player 10 in which the supply power control circuits 40 and 41 for supplying power to the amplifiers 3 and 5 shown in FIG. 11 are provided correspondingly to the respective amplifiers. Although negative feedback is provided to the inverted inputs of the input stage amplifiers 3a and 5a, they are omitted in the figure. Further, the same circuit construction and components thereof that are shown in FIG. 11 are depicted by the same reference numerals, respectively. Therefore, detailed descriptions thereof are omitted. Although not shown, a supply line Vcc is connected to a+side output voltage line of a battery as a portable audio device.

The supply power control circuit 40 is a power control circuit which regulates an output power under control of pulse width modulation (PWM) such that voltage of the output power is maintained at a constant value with respect to an output signal of an audio signal. A supply current control is performed correspondingly to a variation of the internal impedance of an output transistor Q1 which is determined corresponding to a signal level of an input signal. In order to do so, a voltage of the output voltage and a voltage of an output signal C are detected. And, a power corresponding to a difference therebetween is supplied to the transistor Q1 and a control is performed such that a potential difference between an output side of the transistor Q1 and a power supply terminal becomes constant. By this, a power corresponding to the input signal (or output signal) is supplied simultaneously.

This circuit 40 is composed of a detection circuit 50, a switching regulation circuit 60 and a smoothing circuit 70. A capacitor CN depicted by a dotted line is for by-passing high frequency signal and has a capacitance of in the order of 2000 P. This capacitor is theoretically unnecessary.

The switching regulation circuit 60 is a circuit inserted in between the power source line Vcc and a power supply terminal (output terminal 6). This is composed of a control voltage value generating circuit 65 and a switching circuit 66. The control voltage value generating circuit 65 has a transistor Q61 and an amplifier 61 and generates a control voltage value for the switching control. The switching circuit 66 includes a comparator 62, a switching PNP transistor Q62 and a ramp wave generator circuit 63, and controls the switching of ON/OFF controls the power supply line connected to the power source line Vcc by the transistor Q62 and further sends a resultant power to the output terminal 6 through the smoothing circuit 70. This becomes a supply power D for the amplifier 3 which is generated at the output terminal 6.

Under control of the supply power control circuit 40, the voltage at the output terminal 6 is changed according to the level of the output signal C. However, since the potential difference between the output terminal 6 and the output terminal of the output signal of the transistor Q1 is maintained constant, power consumption in the transistor Q1 is reduced as mentioned previously. That is, in this case, when the signal level of the output signal C is low, the voltage at the output terminal 6 becomes low correspondingly. When the signal level of the output signal C is high, the voltage at the output terminal 6 becomes high correspondingly.

A total power consumption of the supply power control circuit 40 and the transistor Q1 must be smaller than that consumed by the conventional transistor Q1. This can be achieved by selecting a high frequency as the switching frequency, for example, making it as high as 50 kHz to 800 kHz, and by maintaining the potential difference between the output terminal 6 and the output terminal of the output signal of the transistor Q1 at a constant voltage lower than an average voltage drop from the conventional power source line Vcc. By this, it is restricted to a smaller value than an average power consumption generated by a voltage drop from the power source voltage Vcc in the conventional transistor Q1.

As mentioned previously, the amplifier 3 push-pull amplifies the audio signal B by the transistors Q1 and Q2 to perform a power amplification and generates the amplified output signal C.

The detection circuit 50 is constituted mainly with an NPN transistor Q50 having a detection terminal provided between a base and emitter thereof. Its detection signal E is supplied to the transistor Q61 of the switching regulation circuit 60 to ON/OFF switch the transistor Q62. The transistor Q50 receives at its emitter a voltage of the supply power D and at its base a voltage of the output signal C outputted from the amplifier 3 through forward-connected diodes D51 and D52. As a result, a detecting operation of the detection circuit 50 depends upon whether or not a voltage difference VD-C between the voltage of the supply power D and the voltage of the output signal C is larger than 1 Vf (base-emitter forward drop voltage).

When this voltage difference VD-C is not larger than 1 Vf, the transistor Q50 is turned ON. By this, a current corresponding to the detection signal E (=error voltage) of the voltage difference 1 Vf-VD-C is supplied to the transistor Q61. The transistor Q61 generates a voltage which is amplified correspondingly to this error voltage as a voltage-divided voltage F (to be described later). On the other hand, when the voltage difference VD-C is larger than 1 Vf, the transistor Q50 is turned OFF. By this, a detection signal E of constant voltage (=Vcc) is generated. Incidentally, 51 is a constant current source for maintaining the diodes D51 and D52 in ON state and generates a reference signal G which is higher than the output voltage C by $2 \times 1$ Vf (=2 Vf) at a base of the transistor Q50.

The control voltage value generating circuit 65 responds to the detection signal E to generate a comparison voltage value P for the comparator 62. This generates a voltage value between the voltage of the power source line Vcc and the voltage of the output signal C at a junction N between series connected resistor circuits R62 and R63 as the voltage-divided voltage F when the transistor Q61 is turned On in response to the detection signal E from the detection circuit 50, in other words, when the voltage difference between the voltage of the output signal C and the voltage of the supply power D becomes not larger than 1 Vf.

The amplifier 61 responds to this voltage-divided voltage F to generate the above mentioned comparison voltage value P by amplifying a difference signal between that and the voltage of the reference signal G. And, it outputs that to a (−) input (on the side of a reference terminal) of the comparator 62.

When the transistor Q61 is turned OFF in response to a reception of the detection signal E from the detection circuit 50, that is, when the voltage difference between the voltage of the output signal C and the voltage of the supply power D of the output terminal 6 becomes larger than 1 Vf, the comparison voltage value P is generated by the amplification of the voltage difference (=2 Vf) between the output signal C and the reference signal G by means of the amplifier 61. This becomes a constant value (as will described later, lower than the signal level of the ramp wave).

The comparator 62 receives at its (+) input a ramp signal S having a constant frequency exceeding an audible frequency from the ramp wave generator circuit 63. And, it compares the voltage of the comparator voltage value P with the voltage of the signal S and outputs a HIGH level signal by which the PNP transistor Q62 is turned OFF as a drive pulse H when the voltage of the signal S exceeds the voltage of the comparison voltage value P. This drive pulse H is supplied to the transistor Q62. It should be noted that the ramp signal S is based on the voltage of the reference signal G and the reference signal G and the signal S are synthesized in a synthesizer circuit 64 before it is inputted to the comparator 62.

The smoothing circuit 70 is connected to an output of the transistor Q62 of the switching circuit 66 and smooths its output power. This circuit includes mainly a coil L70 inserted in series between the output of the transistor Q62 and the power supply line (output terminal 6) to the amplifier 3. With the coil L70, power switched is smoothed, resulting in a smoothed supply power D at the output terminal 6. A flywheel diode is connected between an input terminal of the coil L70 and a ground GND. By this diode, a circular path for a current flowing through the coil L70 is formed. By this, energy stored in the coil L70 when the power supply line is blocked by the switching transistor Q62 is supplied to the side of the amplifier 3 as an inertia current and returned to the coil L70.

Next, an operation of the switching regulation circuit 60 for controlling the voltage difference VD-C between the supply power D and the output signal C to be substantially 1 Vf will be described.

Figure 2:
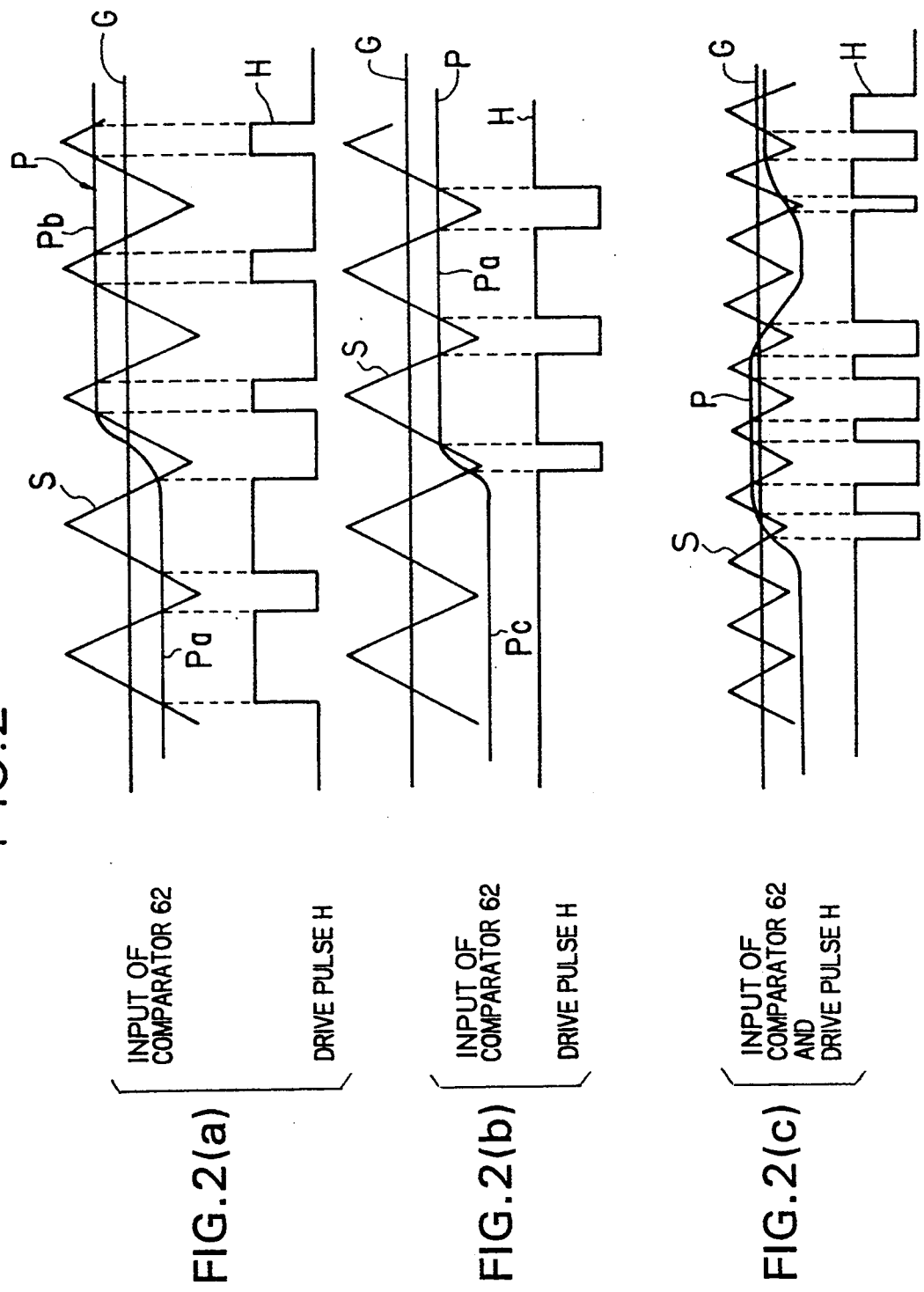
FIG. 2(a)-2(c) show waveforms for explaining an operation of a supply power control circuit in FIG. 1.

As shown in FIG. 2(a)–2(b), the comparator 62 receives at one input the ramp signal S having the reference signal G as a reference and at the other input the comparison voltage value P.

When the voltage difference VD-C is not larger than 1 Vf, as shown in FIG. 2(a), the comparator 62 generates a binary drive pulse H (see H in FIG. 2(a)) corresponding to a result of the comparison in the level between the ramp signal level (waveform S) and the output signal (waveform P) of the amplifier 61, with which the transistor Q62 is switched ON/OFF. In this case, the level Pa of a forward half of the signal P is lower than the reference signal G. This corresponds to a state where the voltage difference VD-C is maintained at slightly lower than 1 Vf but substantially equal to 1 Vf. The level Pb of a rearward half of the signal P is higher than the reference signal G. In this case, the voltage difference VD-C is lower than 1 Vf. In this case, a time period of the drive pulse H for which the latter is at a HIGH level is short so that an amount of supply power D is increased. By this, it is controlled such that the supply power D is increased to increase its voltage to thereby make the voltage difference VD-C become substantially 1 Vf.

By this, when the voltage difference VD-C is not larger than 1 Vf, the level of the comparison voltage value P is changed in a direction in which the difference is made substantially equal to 1 Vf and a current corresponding thereto is supplied to the amplifier 3. And, the voltage difference VD-C becomes substantially 1 Vf. That is, the PWM is performed in correspondence with to a result of comparison between the comparison voltage value P and the ramp wave S and the switching transistor Q62 is ON/OFF controlled by the drive pulse H. Such control is performed correspondingly to the value of the detection signal E.

When the difference between the voltage of the output signal C and the voltage of the supply power D is larger than 1 Vf, the transistor Q50 is turned OFF. In this case, the detection voltage E becomes the source voltage Vcc. Therefore, the transistor Q61 is turned OFF, generating the voltage difference 2 Vf. As a result, the comparison voltage value P becomes a level Pc shown in FIG. 2(b) and a constant voltage which is lower than the reference signal G by 2 Vf is supplied to the comparator 62. As a result, a drive pulse H such as shown by a high level waveform H in FIG. 2(c) is generated to turn OFF the transistor Q62 of the switching circuit. As a result, the power supply is provided to the amplifier 3 such that the voltage difference VD-C becomes substantially 1 Vf and the comparison voltage value P is returned to the level Pa.

The above mentioned level Pa of the comparison voltage value P is determined by values of the resistors R62 and R63 and is selectable. Further, the above mentioned level Pc of the comparison voltage value P is determined in relation to an amplitude of the ramp wave and this is also selectable. Further, the speed of response to a change in the level of the comparison voltage value P is selected to be high enough with respect to a change of the audio signal in designing the circuit.

As a specific example, when the voltage level of the input signal B is decreased greatly, the internal impedance of the transistor Q1 is abruptly increased and the voltage difference between the voltage of the output signal C and the voltage of the supply power D of the output terminal 6 becomes higher than 1 Vf. In this case, the comparison voltage value P becomes lower in level than the ramp wave S as shown by Pc and the drive pulse H of the comparator 62 is maintained at a HIGH level to maintain the transistor Q62 an OFF state. Such control is performed continuously until the voltage difference between the output signal C and the voltage of the supply power D of the output terminal 6 becomes near 1 Vf.

For example, when the voltage level of the input signal B is increased greatly, the internal impedance of the transistor Q1 is lowered abruptly and the voltage difference between the output signal C and the voltage of the supply power D of the output terminal 6 becomes lower than 1 Vf. In such a case, the comparison voltage value Pb corresponding to an error reducing 1 Vf is supplied. By this, the control is performed such that the voltage of the supply power D is increased to make a target value of the voltage difference equal to 1 Vf.

And, for a gentle change of the level of the input signal B, the two controls for the case where it is equal to or lower than 1 Vf and for the case where it is not higher than 1 Vf are performed alternatively for a short time correspondingly to a change in the internal impedance of the transistor Q1, resulting in alternating pulses including pulses having widths covering a plurality of cycles of the ramp signal S and pulses having shorter widths, as shown in FIG. 2(c).

Frequency of the ramp wave is preferably within a range 100 kHz to 500 KHz in view of the fact that an upper limit of the audible frequency is generally 20 KHz and in view of the ease in which the regulation of an oscillator circuit can be powered efficiently.

In this case, 1 Vf (about 0.7 V) of the voltage difference VD-C which is the target value of control is a value determined in correspondence to the fact that the transistor Q1 of the amplifier 3 is a single state transistor. That is, the voltage difference VD-C between the voltage of the supply power D to the amplifier 3 and the voltage of the output signal C of the amplifier 3 is selected from values which do not degrade the response performance of the transistor Q1 as a value which is as close as possible to a collector—emitter voltage which is the minimum necessary to allow the amplifier 3 to perform its amplification operation. Therefore, if the transistor Q1 is composed of Darlington-connected transistors, the above mentioned voltage difference VD-C is made to be about 2 Vf (about 1.4 V). In detail, another diode is further connected to the diodes D51 and D52.

The internal construction of the supply power control circuit 41 provided on the side of the amplifier 5 is the same as that of the supply power control circuit 40. Its output terminal 6a corresponds to the output terminal 6 and its supply power D' corresponds to the supply power D. Therefore, description of the internal construction and its operation is omitted.

Now, an operation of this tape player will be described.

During reproduction, the read signal A is obtained from a tape (not shown) on which the audio signal is recorded, through the read head 1. With respect to this read signal A, the audio signal B is obtained by the signal reproducing processing circuit 2. This audio signal B is push-pull amplified by the transistors Q1 and Q4 of the amplifier 3 and the transistors Q3 and Q2 of the amplifier 5, respectively. In this case, the current corresponding to the level of the input signal B for the upper half cycle of the reference level of the audio signal B is supplied from the supply power control circuit 40. For the lower half cycle, the current supplied from the transistor Q3 of the amplifier 5 is sunk through the transistor Q2. By this, the input signal B is power-amplified to provide the output signals C and C' by which the loud speaker 4 is driven. In this case, for the upper half cycle, the voltage difference VD-C between the voltage of the supply power D to the amplifier 3 and the voltage of the output signal C is controlled such that it is maintained at a value of 1 Vf which is near the minimum value necessary to operate the amplifier 3. For the lower half cycle, it is similarly controlled such that the voltage difference VD'-C' between the voltage of the supply power D' to the amplifier 5 and the voltage of the output signal C' is maintained at a value of 1 Vf which is near the minimum value necessary to operate the amplifier 5.

By this, power loss in the amplifiers 3 and 5 becomes a voltage drop in the order of 1 Vf corresponding to the voltage differences VD-C and VD'-C' and the power consumption is reduced compared with the conventional consumption.

Although power loss due to switching of the power supply line is mainly due to resistance when the transistor Q62 is ON as mentioned previously, the power consumption can be restricted practically since the ON resistance value is small. Particularly, since the drive circuit for the PWM control for switching the transistor Q62 can be constituted by an IC circuit having a differential amplifier construction, its power consumption can be restricted to a small value compared with the power consumption of the power amplifier stage.

Figure 3:
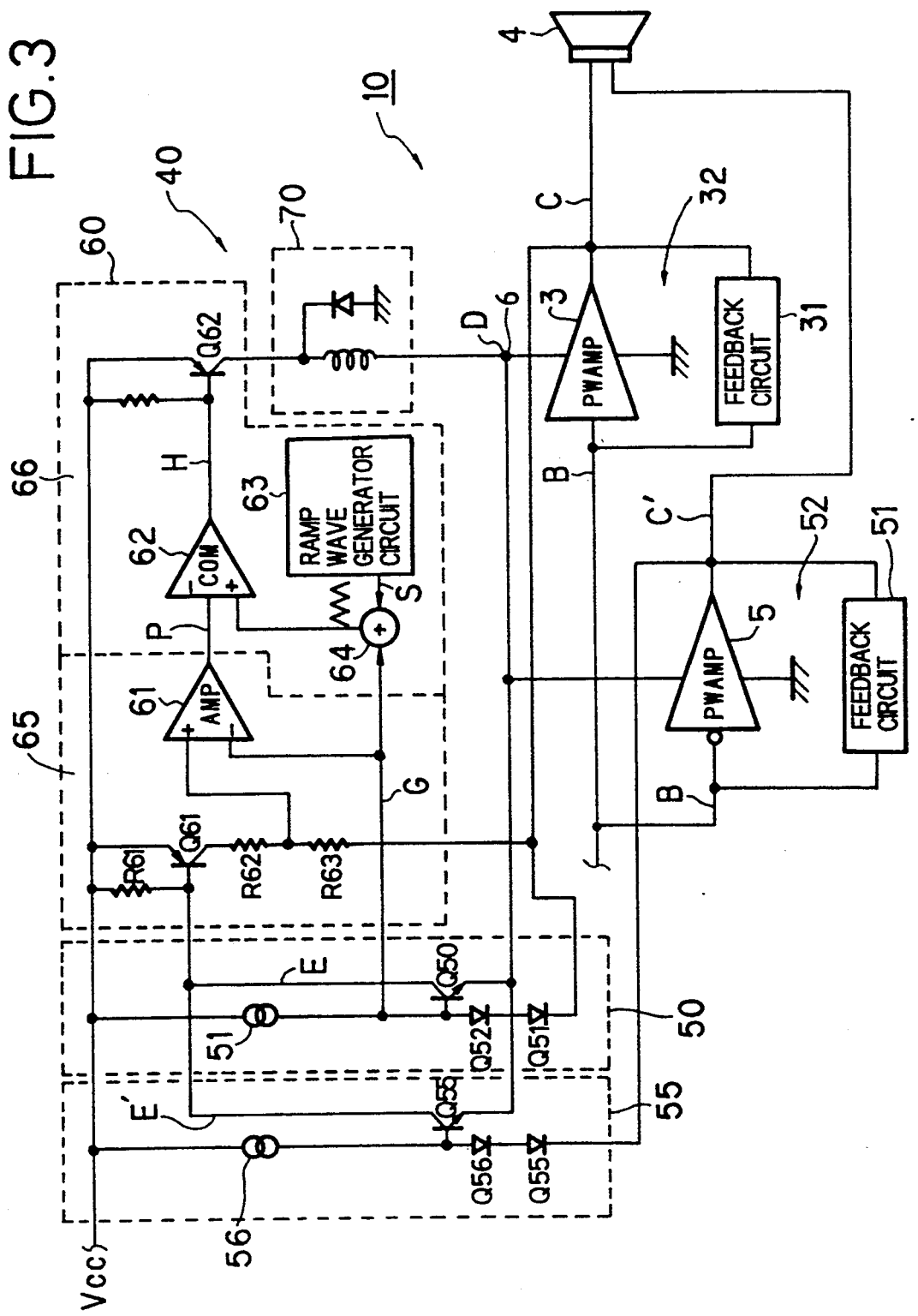
FIG. 3 is a block diagram of an embodiment in which power is supplied commonly to the respective output stage amplifiers by using a single supply power control circuit instead of the two supply power control circuit in FIG. 1.

Next, an example in which the supply power control circuit 41 is removed and power is commonly supplied from the supply power control circuit 40 to the amplifiers 3 and 5 will be described with respect to FIG. 3. In FIG. 3, a circuit construction including a loud speaker 4 and a supply power control circuit 40 (including a detection circuit 50, a switching regulation circuit 60 and a smoothing circuit 70) is the same as that of the preceding embodiment. In FIG. 3, an amplifier 3 includes a feedback circuit 31 as an output stage amplifier 32. Further, the amplifier 5 shown in FIG. 11 includes a feedback circuit 51 as the output stage amplifier 52.

The amplifier 52 is connected to the supply power control circuit 40 through a detection circuit 55 and output terminal 6. The detection circuit 55 is similar to the detection circuit 50 and connected in parallel to the detection circuit 50. Further, a current source 56 of the detection circuit 55 corresponds to a current source 51 of the detection circuit 50.

The detection circuit 55 produces a detection signal E' corresponding to whether or not a voltage difference VD-C' between a voltage of a supply power D and an output signal voltage C' is larger than 1 Vf. The detection signal E' is wired-OR with a detection signal E and sent to a transistor Q61 of the switching regulation circuit 60.

By this, the PWM control in the switching regulation circuit 60 becomes dependent on not only the voltage difference VD-C but also the voltage difference VD-C' on the side of the amplifier 34. There is no problem in current supplying operations of the respective amplifiers 32 and 52 since, when one of the transistors Q1 and Q3 is ON, the other is OFF.

Figure 4:
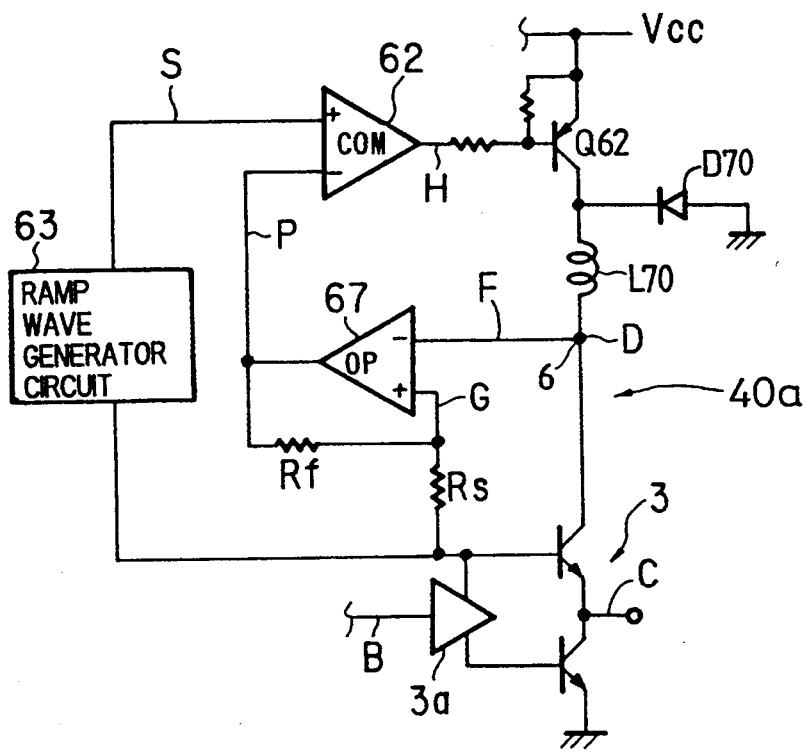
FIG. 4 is a block diagram of, mainly, a supply power control circuit of another embodiment of the present invention when applied to a portable stereo cassette tape player.

FIG. 4 is an embodiment of the supply power control circuit 40a in which one of the voltages to be detected by the detection circuit is changed from the voltage of the output signal C to the voltage of the input signal B.

In FIG. 4, the supply power control circuit 40a performs a control such that the voltages of the output signal C and the supply power D are made constant correspondingly to the voltages of the input signal B and the supply power D.

The same circuit components as those in FIG. 1 are depicted by the same reference numerals, respectively in FIG. 4. The differences include that a circuit from the detection circuit 50 to the amplifier 61 is replaced by a detection/amplifier circuit 67 constituted by an operational amplifier of inverted amplification type and that the reference signal G is set as a base bias potential of the transistor Q1. Therefore, the ramp wave generator circuit 63 also operates on a reference potential of a base of the transistor Q1.

The detection/amplifier circuit 67 has a (−) input terminal supplied with the voltage of the supply power D and a (+) input terminal supplied with the voltage of the input signal B obtained from the base of the transistor Q1 through a resistor Rs as a reference side potential. That is, the resistor Rs converts a current value of the input signal B into a voltage value. Further, it includes a feedback resistor Rf connected between an output side thereof and the (+) input terminal. A voltage of an output signal P thereof is sent to a (−) input terminal of the comparator 62 which is a reference input terminal. An output of the ramp wave generator circuit 63 is supplied to the (+) input terminal of the comparator 62. In such a circuit, a divided voltage signal F generated from the detection signal and the supply power D are coincident and the reference signal G becomes the same level due to the fact that the input terminal of the operational amplifier is a virtual short.

The difference between the voltages of the output signal and the input signal of the output stage amplifier is caused by a level difference therebetween corresponding to the amplification factor of the output stage amplifier and the phase between the input signal and the output signal is substantially the same. Considering this matter, the same operation as that in the previous embodiment is possible even if the input signal B is the object of detection. Therefore supply power control circuit 40 is changeable to the control circuit 41.

Figure 5:
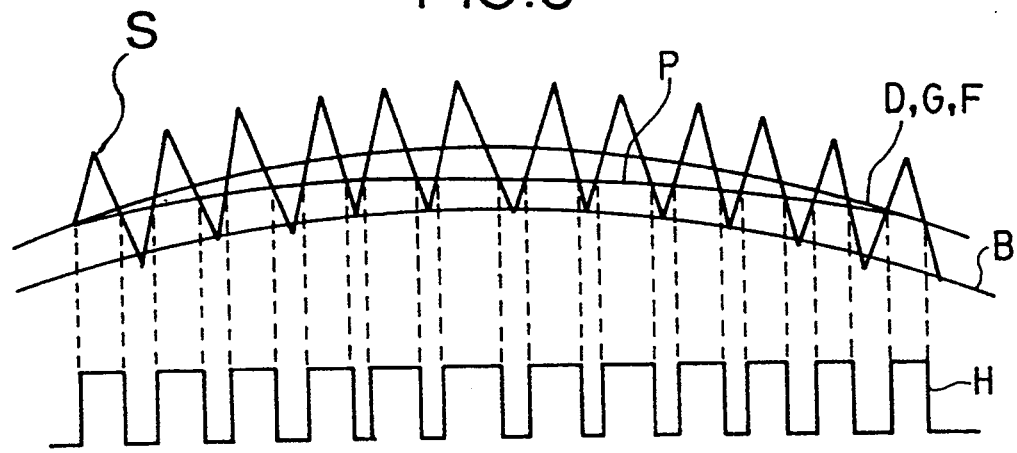
FIG. 5 shows waveforms for an explanation of the operation of the supply power control circuit in FIG. 4.

The frequency of the ramp signal S is much different from that of the input signal B. FIG. 5 explains the operation thereof theoretically with the frequency of the ramp signal S being low in relation to the input signal B.

Waveforms (see FIG. 5) of the ramp signal S and the reference signal P are obtained correspondingly to the input signal B and PWM pulse corresponding to the width of the ramp wave exceeding the reference signal P is supplied to the transistor Q62. As a result, in relation to the output signal C, the PWM control is performed with the waveform relation shown by H in FIG. 5.

Although, in a above mentioned embodiments, the reproduced signal from a tape player has been described as an example, other audio signals such as microphone may be used as the input signal or broadcasted signal input, etc. In such case, the signal reproduction processing circuit may be a preamplifier to be inserted into an upstream of the output stage amplifier.

Further, although the example in which the amplified signal is sent to a loud speaker has been described, the present invention is not limited thereto. For example, such signal may be used as an input to a recording circuit or to a larger power amplifier.

Although the transistors Q50 and Q55 of the detection circuit 50 are NPN transistors, they may be PNP transistors. In such case, emitters thereof receive the output signal C and bases thereof receive the voltage signal of the supply power D.

If a larger current capacity is required, the by-pass capacitor CN between the output terminal 6 of the supply power D and the ground GND may be replaced by a smoothing capacitor having larger capacity.

Figure 6:
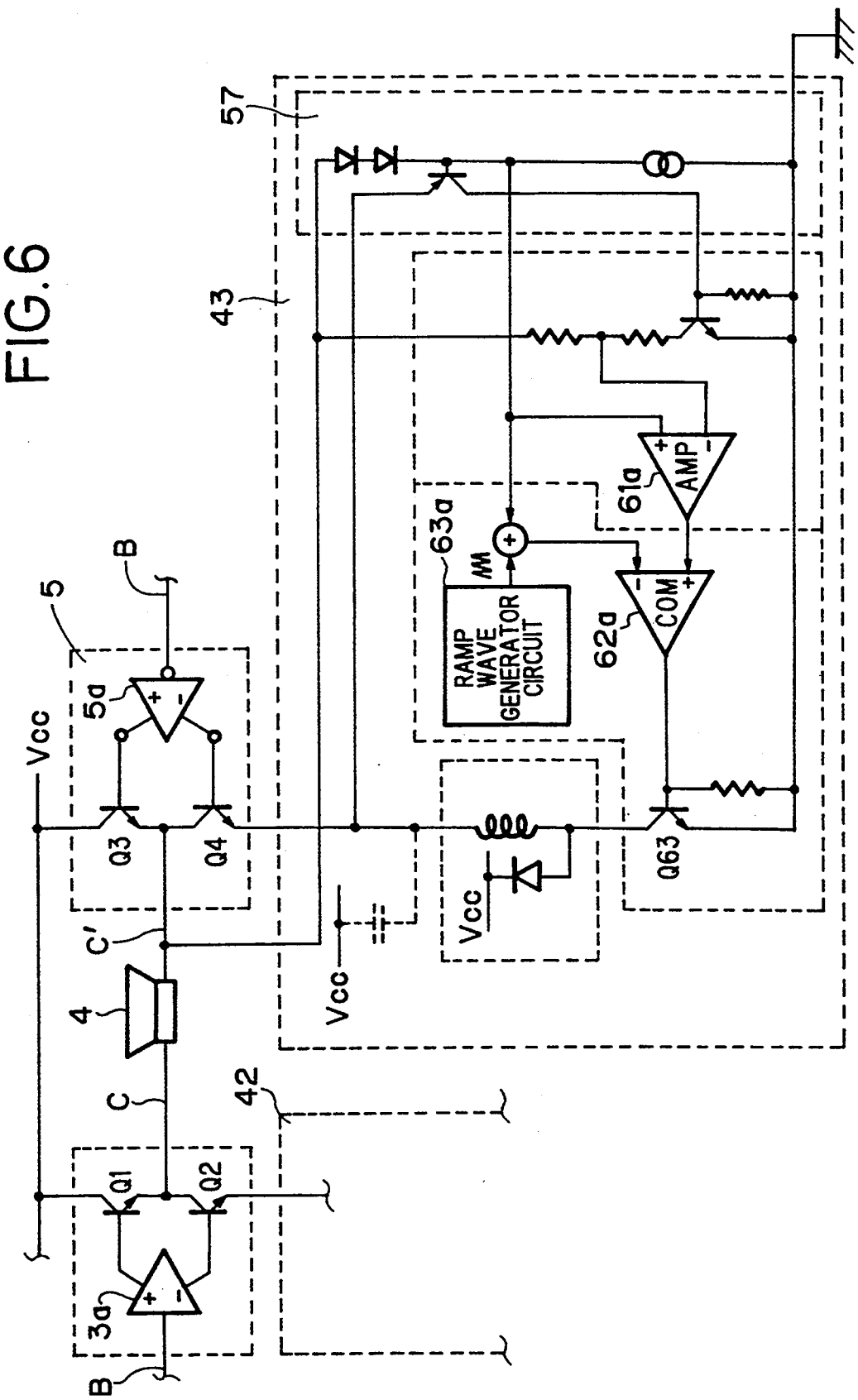
FIG. 6 is a block circuit diagram of another embodiment of the present invention corresponding to the embodiment in FIG. 1, with a supply power control circuit being provided on the side of ground.

FIG. 6 shows an embodiment corresponding to the embodiment shown in FIG. 1, in which supply power control circuits 42 and 43 are provided between the transistors Q2 and Q4 and the ground, respectively.

The supply power control circuits 42 and 43 have identical circuit constructions and differ from the supply power control circuit 40 in that the NPN (PNP) transistors of the supply power control circuit 40 are replaced by PNP (NPN) transistors and that the power source line Vcc and the ground GND are inverted by reversing the connection of the terminal of the comparator on the input side and connection of the terminal on the input side of the operational amplifier. 57 is the detection circuit and corresponds to the detection circuit 50. The NPN transistor Q63 is a switching transistor and corresponds to the PNP transistor Q62. An amplifier 61a corresponds to the amplifier 61, a comparator 62a correspond to the comparator 62 and a ramp wave generator circuit 63a corresponds to the ramp wave generator circuit 63. Its operation is just opposite to the previously described operation in that only the polarity thereof is opposite and therefore details thereof are omitted.

For the supply power control circuit 40a shown in FIG. 4, it can be used as a similar one to the supply power control circuits 42 and 43 by making the power source line Vcc and the ground GND reversed by similarly reversing the connection of the terminals of the comparator 62 and the operational amplifier 67.

Figure 7:
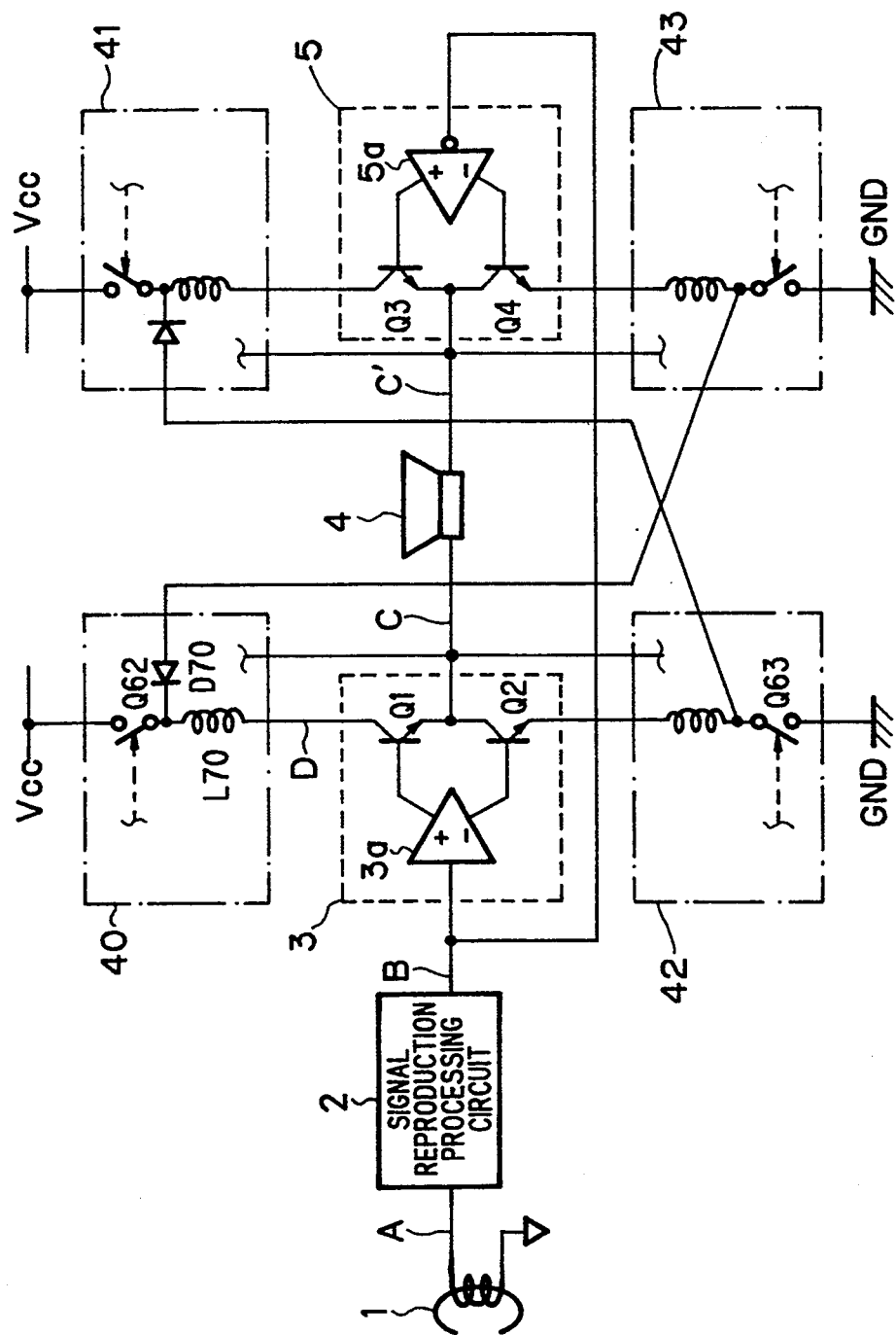
FIG. 7 is a block diagram of another embodiment which is a combination of the embodiments shown in FIGS. 1 and 6.

FIG. 7 is an embodiment which is a combination of the embodiments shown in FIGS. 1 and 6. Supply power control circuits 40, 41, 42 and 43 are separately provided correspondingly to transistors Q1 to Q4. In order to circulate currents flowing through coils of the respective supply power control circuits 40, 41, 42 and 43, the fly-wheel diodes of the supply power control circuits 42 and 43 are removed, a terminal of the coil of the supply power control circuit 42 on the side of ground is connected to the fly-wheel diode of the supply power control circuit 41 and a terminal of the coil of the supply power control circuit 43 on the side of ground is connected to the fly-wheel diode of the supply power control circuit 43, so that current flowing the coil when the transistor is turned OFF is circulated.

Figure 8:
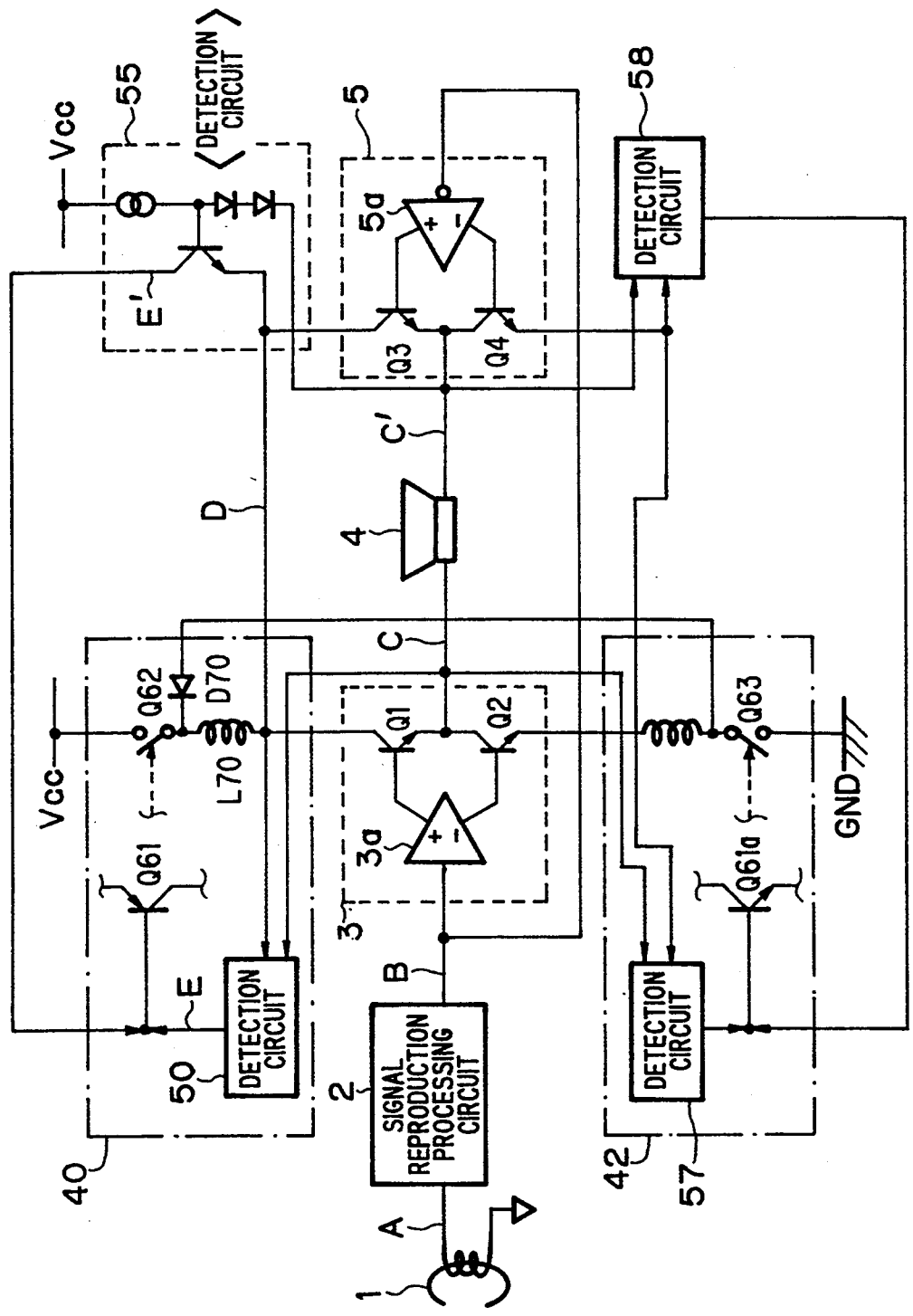
FIG. 8 is a block diagram of another embodiment which is a combination of the embodiments shown in FIGS. 3 and 7.

FIG. 8 is an embodiment which is a combination of the embodiments shown in FIGS. 3 and 7. However, the respective output stage amplifiers have no special feedback circuits 31 and 51 such as shown in FIG. 3. A detection circuit 58 is identical to a detection circuit 57 and these detection circuits are wired-OR similarly to the detection circuits 50 and 55 shown in FIG. 3.

Figure 9:
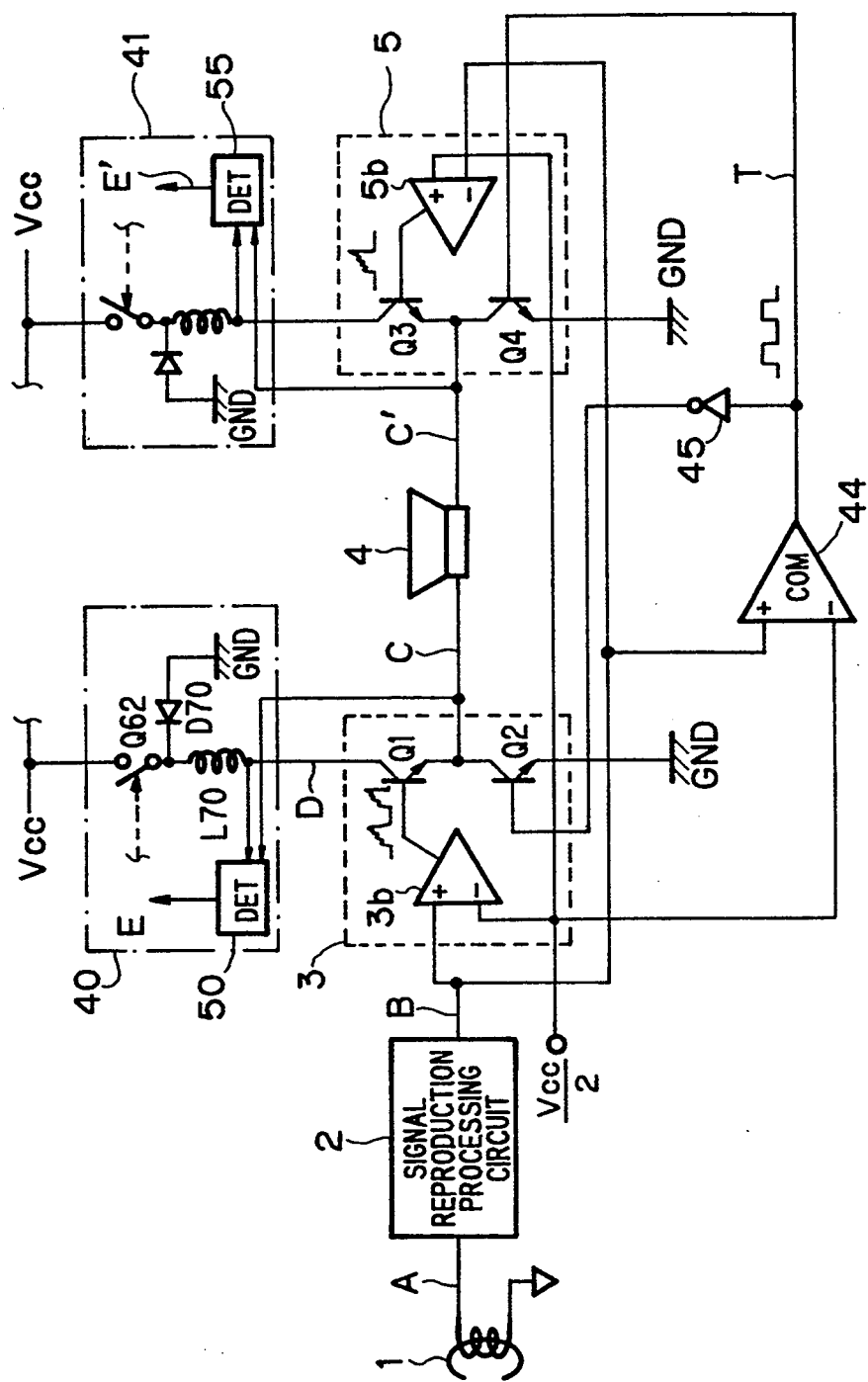
FIG. 9 is a block diagram of another embodiment of a simplified circuit for turning ON the transistor on the pull side of the push-pull output amplifier according to the input signal.

FIG. 9 is a simplified modification which operates while the transistors Q2 and Q4 on the pull side (sink side) of the push-pull output amplifiers 3 and 5 are maintained in an ON state with a timing of the half cycles of these transistors.

This corresponds to the embodiment shown in FIG. 1 with the input stage amplifiers 3a and 5a thereof being replaced by differential amplifiers 3b and 5b, respectively. The differential amplifier 3b is supplied at a (+) input and a (−) input with the input audio signal B and the reference voltage of Vcc/2, respectively, amplifies only an upper half cycle of the input audio signal B and outputs it. The differential amplifier 5b is supplied at a (−) input and a (+) input with the input audio signal B and the reference voltage of Vcc/2, respectively, amplifies only a lower half cycle of the input audio signal B and outputs it. The comparator 44 is supplied at a (+) input and a (−) input with the input audio signal B and the reference voltage of Vcc/2, respectively, and generates a pulse signal T corresponding to the upper half cycle of the input signal B. The signal T is supplied to a base of the transistor Q4 and, after being inverted by the inverter 45, to a base of the transistor Q2.

By this, the transistor Q4 is in an ON state during the upper half cycle of the input signal B and the transistor Q2 is in an ON state during the lower half cycle of the input signal B. As a result, the supply power control circuits 42 and 43 provided on the ground side become unnecessary. Since the ON resistance of the transistors Q2 and Q4 is relatively small, power consumption as small as that in the case shown in FIG. 7 can be achieved.

Figure 10:
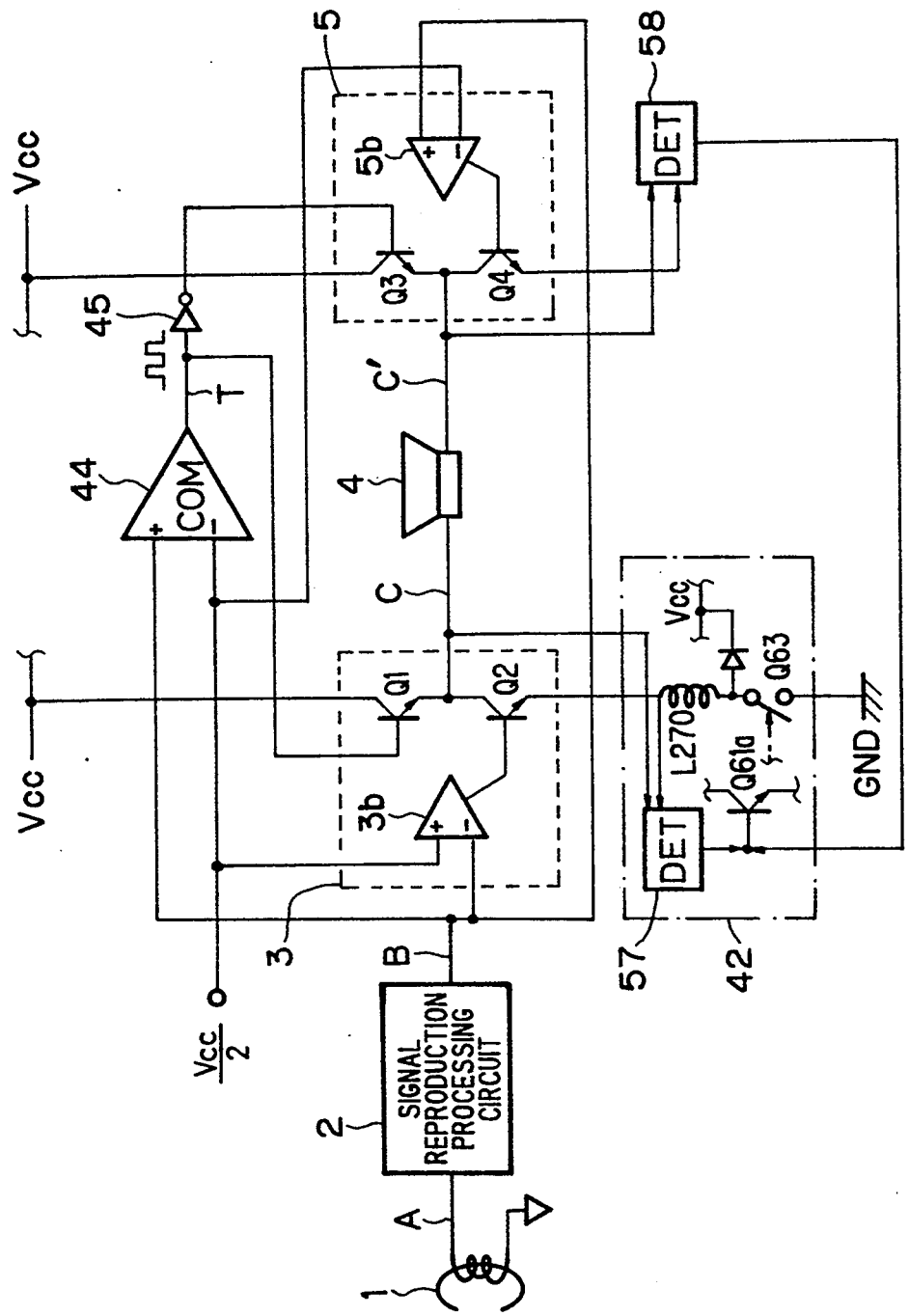
FIG. 10 is a block diagram of another embodiment of a simplified circuit for turning ON the transistor on the push side of the push-pull output amplifier according to the input signal.

FIG. 10 is a simplified modification which operates while the transistors Q1 and Q3 on the push side (supply side) of the push-pull output amplifiers 3 and 5 are maintained in an ON state with a timing of the half cycles of these transistors. The transistor Q1 is in an ON state during the upper half cycle of the input signal B and the transistor Q3 is in an ON state during the lower half cycle of the input signal B. As a result, the supply power control circuits 40 and 41 provided on the power supply side become unnecessary, and the supply power control circuit 43 becomes unnecessary.

Further, in an embodiment which is a combination of the embodiments shown in FIGS. 3 and 9, the supply power control circuit 41 becomes unnecessary.

Further, the differential amplifiers 3b and 5b are replaced by the input stage amplifiers 3a and 5a when the upper and lower half cycle of the input signal B generate respectively in the before stage of the amplifier 3b and 5b.

What is claimed is:

1. A power amplifier circuit for an audio signal, comprising:
   a first push-pull amplifier for amplifying an audio signal;
   a second push-pull amplifier for amplifying the audio signal;
   a first switching circuit including a first ramp wave generator circuit oscillating at a frequency in a range from 50 kHz to 800 kHz, a first comparator having one input supplied with an output of said first ramp wave generator circuit and another input supplied with a first control signal and a first switching transistor for ON/OFF switching of power supplied from a power source line in accordance with an output of said first comparator and for feeding power to said first amplifier;
   a second switching circuit including a second ramp wave generator circuit oscillating at a frequency in a range from 50 kHz to 800 kHz, a second comparator having one input supplied with an output of said second ramp wave generator circuit and another input supplied with a second control signal and a second switching transistor for ON/OFF switching of power supplied from said power source line in accordance with an output of said second comparator and for feeding power to said second amplifier;
   a first smoothing circuit having a first coil provided between the feed power output of said first switching circuit and a terminal of said first amplifier for receiving the feed power and having a first diode for forming a circulating path for supplying said first amplifier with a current of said first coil in a period when said first switching transistor is in an OFF state;
   a second smoothing circuit having a second coil provided between the feed power output of said second switching circuit and a terminal of said second amplifier for receiving the feed power and having a second diode for forming a circulating path for supplying said second amplifier with a current of said second coil in a period when said second switching transistor is in an OFF state;
   a first control circuit including a first control voltage value generator circuit for generating a first voltage value corresponding to a voltage difference between a voltage signal of the feed power of the first smoothing circuit and a voltage of a first output signal of said first amplifier as the first control signal and supplying the first voltage value to said another input of said first comparator to control the first comparator output for controlling a switching period of said first switching transistor such that the voltage difference between the voltage of said first output signal and the voltage of the feed power of the first smoothing circuit becomes substantially constant;
   a second control circuit including a second control voltage value generator circuit for generating a second voltage value corresponding to a voltage difference between a voltage signal of the feed power of the second smoothing circuit and a voltage of a second output signal of said second amplifier as the second control signal and supplying the second voltage value to said said another input of said second comparator to control the second comparator output for controlling a switching period of said second switching transistor such that the voltage difference between the voltage of said second output signal and the voltage of the feed power of the second smoothing circuit becomes substantially constant.

2. A power amplifier circuit for an audio signal, comprising:
   a first push-pull amplifier for amplifying an audio signal;
   a second push-pull amplifier for amplifying the audio signal;
   a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of current from one of said first amplifier and said second amplifier to a ground in accordance with an output of said comparator for grounding the current;
   a smoothing circuit having a coil provided between an input of said switching circuit for receiving the current and a terminal of one of said first amplifier and said second amplifier for passing the current to said ground, and having a diode for forming a circulating path for supplying one of said first amplifier and said second amplifier with a current of said coil in a period when said switching transistor is in an OFF state;
   a control circuit including a control voltage value generator circuit for generating a voltage value corresponding to a voltage difference between a voltage signal of the current from one of said first amplifier and said second amplifier and a voltage of a pull output signal of one of said first amplifier and said second amplifier as the control signal and supplying the voltage value to said said another input of said comparator to control the comparator output for controlling a switching period of said switching transistor such that the voltage difference between the voltage of said pull output signal and the voltage of the current from said one of said first amplifier and said second amplifier becomes substantially constant.

3. A device for amplifying an audio signal and supplying an amplified signal to a speaker, comprising:
   a preamplifier for amplifying an audio signal;
   a first output stage push-pull amplifier for amplifying the audio signal amplified by said preamplifier and supplying it to said speaker;
   a second output stage push-pull amplifier for amplifying the audio signal amplified by said preamplifier and supplying it to said speaker;
   a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator and for feeding power to said first and second amplifier;
   a smoothing circuit having a coil provided between the feed power output of said switching circuit and respective terminals of said first and second amplifiers for receiving a feed power and having a diode for forming a circulating path for supplying said first and second amplifiers with a current of said coil in a period when said switching transistor is in an OFF state;

a control circuit including a control voltage value generator circuit for generating a voltage value corresponding to a voltage difference between a voltage signal of the feed power and a voltage of one of a first output signal of said first amplifier and a second output signal of said second amplifier as the control signal and supplying the voltage value to said said another input of said comparator to control the comparator output for controlling a switching period of said switching transistor such that the voltage difference between the voltage of one of said first output signal and said second output signal and the voltage of the feed power becomes substantially constant.

4. A device for amplifying an audio signal and supplying an amplified signal to a speaker, comprising:

a preamplifier circuit for amplifying an audio signal;

a first output stage push-pull amplifier for amplifying an output of said preamplifier circuit and outputting it to said speaker;

a second output stage push-pull amplifier for amplifying the output of said preamplifier circuit and outputting it to said speaker;

a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching current from one of said first amplifier and said second amplifier to a ground in accordance with an output of said comparator for grounding the current;

a smoothing circuit having a coil provided between an input of said switching circuit for receiving the current and a terminal of one of said first amplifier and said second amplifier for passing the current to said ground and having a diode for forming a circulating path for supplying one of said first amplifier and said second amplifier with a current of said coil in a period when said switching transistor is in an OFF state;

a control circuit including a control voltage value generator circuit for generating a voltage value corresponding to a voltage difference between a voltage signal of the current from one of said first and second amplifiers and a voltage of a pull output signal of one of said first and second amplifiers as the control signal and supplying the voltage value to said said another input of said comparator to control the comparator output for controlling a switching period of said switching transistor such that the voltage difference between the voltage of said pull output signal and the voltage of the current from said one of said first and second amplifiers becomes substantially constant.

5. A power amplifier circuit for an audio signal comprising:

a first amplifier for amplifying an audio signal;

a second amplifier for amplifying the audio signal;

a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator for feeding power to one of said first amplifier and said second amplifier;

a smoothing circuit having a coil provided between the feed power output of said switching circuit and a terminal of one of said first amplifier and said second amplifier for receiving a feed power and having a diode for forming a circulating path for supplying one of said first amplifier and said second amplifier with a current of said coil in a period when said switching transistor is in an OFF state;

a control circuit including a control voltage value generator circuit for generating a voltage value corresponding to a voltage difference between a voltage signal of the feed power and a selected voltage of one of a first output signal of said first amplifier and a second output signal of said second amplifier as the control signal and supplying the voltage value to said said another input of said comparator to control the comparator output for controlling a switching period of said switching transistor such that the voltage difference between the voltage of one of said first output signal and said second output signal and the voltage of the feed power becomes substantially constant.

6. The power amplifier circuit for an audio signal claimed in claim 5, wherein said control circuit includes a transistor responsive to the voltage signal of the feed power received in one of an emitter and a base thereof and said selected voltage received in the other of the base and the emitter for generating a detection signal corresponding to a difference in voltage between the voltage difference and a predetermined voltage, and wherein said control voltage value generator circuit responds to the detection signal to generate the voltage value to thereby control the voltage difference to be substantially equal in potential to said predetermined voltage which is approximately a minimum voltage necessary to operate said amplifier.

7. The power amplifier circuit for an audio signal claimed in claim 6, wherein said selected voltage received in the other of the emitter and the base is passed through a diode circuit which generates said predetermined voltage.

8. The power amplifier circuit for an audio signal claimed in claim 7, wherein said diode circuit comprises at least two diodes.

9. The power amplifier circuit for an audio signal claimed in claim 5, wherein said control voltage value generator circuit has a (+) input and a (−) input and is responsive to the voltage signal of the feed power being received in one of the (+) input and the (−) input and said selected voltage being received in the other of said (+) input and said (−) input for generating said control signal.

10. The power amplifier circuit for audio signal claimed in claim 9, wherein said selected voltage received in the other of said inputs is passed through a resistor which generates a voltage of a value higher by a predetermined amount than said output signal as a detection signal, said value of voltage being approximately a minimum voltage necessary to operate said amplifier.

* * * * *